Figure 1:
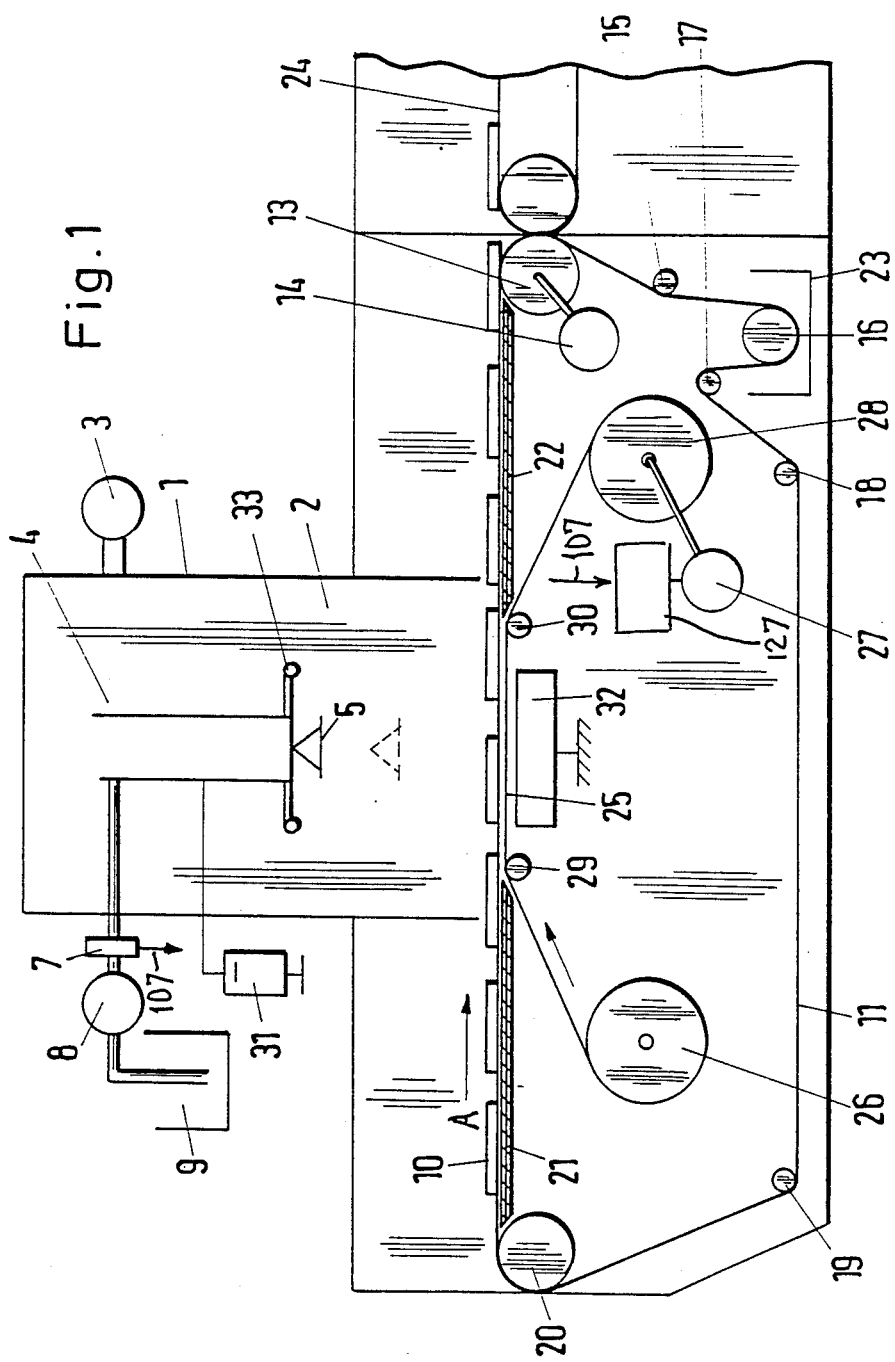

United States Patent [19]

Heine et al.

[11] Patent Number: 4,836,137

[45] Date of Patent: Jun. 6, 1989

[54] APPARATUS FOR ELECTROSTATICALLY SPRAY COATING WORKPIECES WITH AIR IONIZING NEUTRALIZING DEVICE

[75] Inventors: Werner Heine; Helmut Kurz, both of Winnenden, Fed. Rep. of Germany

[73] Assignee: Kopperschmidt-Mueller GmbH & Co. KG, Bielefeld, Fed. Rep. of Germany

[21] Appl. No.: 95,319

[22] Filed: Sep. 10, 1987

[30] Foreign Application Priority Data

Sep. 13, 1986 [DE] Fed. Rep. of Germany ....... 3631270

[51] Int. Cl.⁴ .................... B05C 11/00; B05B 5/02
[52] U.S. Cl. .................... 118/663; 118/50.1; 118/630; 118/631; 118/326; 118/324; 118/70
[58] Field of Search ............... 118/326, 630, 631, 324, 118/70, 50.1, 663, 688, DIG. 4, 664; 427/33, 420

[56] References Cited

U.S. PATENT DOCUMENTS

| | | | |
|---|---|---|---|
| 1,627,096 | 5/1927 | Jones et al. | 118/324 |
| 1,979,758 | 11/1934 | Merritt | 118/324 |
| 2,246,502 | 6/1941 | Bramsen et al. | 118/324 X |
| 2,847,324 | 12/1958 | Ogint | 427/424 X |
| 2,854,946 | 10/1958 | Norris | 118/324 |
| 2,963,002 | 12/1960 | Glaus | 118/324 |
| 3,739,745 | 6/1973 | Turpin | 118/324 X |
| 3,902,455 | 9/1975 | Lehmann et al. | 118/630 |

FOREIGN PATENT DOCUMENTS 2446767 4/1977 Fed. Rep. of Germany.

Primary Examiner—Shrive Beck
Assistant Examiner—Alain Bashore
Attorney, Agent, or Firm—Peter K. Kontler

[57] ABSTRACT

Apparatus for spray coating plate-like or otherwise configurated workpieces has an endless apertured conveyor which transports a series of workpieces along a horizontal path beneath a rotary atomizer which sprays coating material onto the advancing workpieces. The coating material which bypasses the workpieces and passes through the apertures of the conveyor impinges upon and gathers on a web of paper or non-woven fibrous material which is advanced at a speed less than the speed of the conveyor so that the web can be used with great economy because it is or can be advanced at a rate such that, or only when, its portion which is in the path of sprayed coating material cannot gather and retain additional coating material.

24 Claims, 2 Drawing Sheets

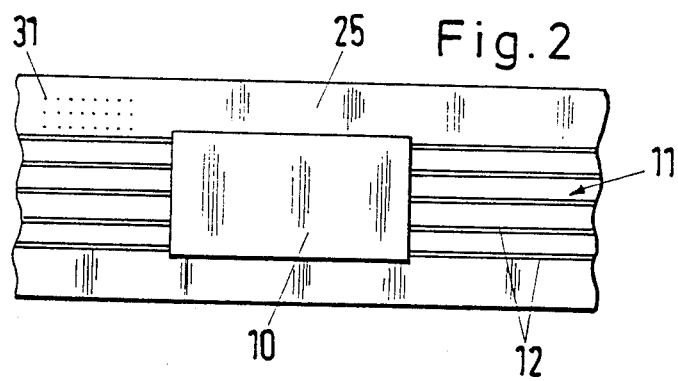
Fig. 2
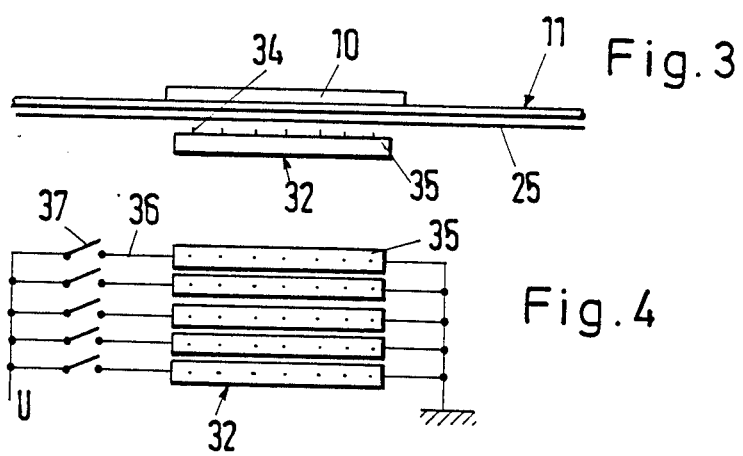
Fig. 3
Fig. 4
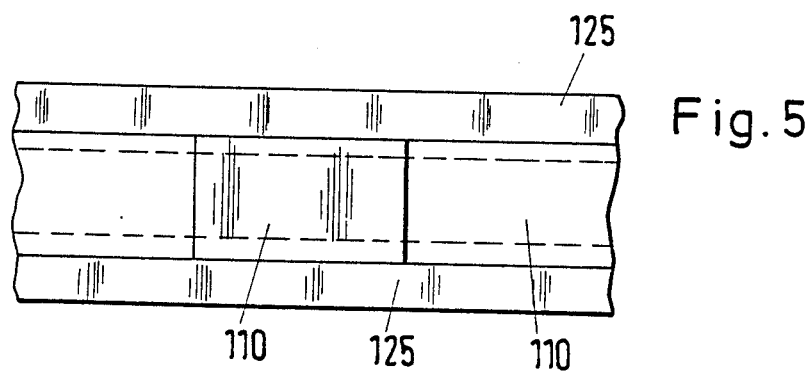
Fig. 5

APPARATUS FOR ELECTROSTATICALLY SPRAY COATING WORKPIECES WITH AIR IONIZING NEUTRALIZING DEVICE

BACKGROUND OF THE INVENTION

The invention relates to apparatus for applying sprays of coating material to workpieces. More particularly, the invention relates to improvements in apparatus of the type wherein a mask is used to intercept that part of the spray which bypasses the workpieces.

It is known to apply sprays of coating material, such as photosensitive resists and solder resists, to copper-lined conductor plates or like workpieces by means of a rotary atomizer and an electrostatic field. The mask which is used in such apparatus is a belt or band conveyor which consists of a web of paper and transports the workpiece along a horizontal path beneath and past the coating station. Thus, the paper web performs the dual function of transporting the workpieces and of intercepting that part of the spray which bypasses the moving workpieces. Interception is necessary in order to avoid contamination of the area beneath the coating station. As a rule, the apparatus comprises a grounded electrode which is installed at a level below the path of the workpieces and the paper web.

A drawback of such apparatus is that they consume large quantities of masking material. This is due to the fact that the paper web serves as a conveyor for the workpieces and, therefore, its speed must match the speed of transport of workpieces past the coating station. The rate of consumption of web material is directly proportional to the speed at which the workpieces are transported toward, past and beyond the coating station.

OBJECTS AND SUMMARY OF THE INVENTION

An object of the invention is to provide an apparatus wherein the part or parts which gather non-applied portions of the spray of coating material can be used with greater efficiency and with greater economy than in heretofore known apparatus.

Another object of the invention is to provide a novel and improved work-transporting conveyor for use in the above outlined apparatus.

A further object of the invention is to provide the apparatus with novel and improved means for effecting an electrostatic application of sprays of coating material to workpieces.

An additional object of the invention is to provide the apparatus with novel and improved means for treating the workpieces, the conveyor and the part or parts which gather the surplus of coating material subsequent to contact with coating material.

Still another object of the invention is to provide a novel and improved housing for the spray generator or generators of the above outlined apparatus.

A further object of the invention is to provide a novel and improved method of economically utilizing the part or parts which serve to gather and retain sprays of coating material which bypasses the workpieces.

Another object of the invention is to provide a method which renders it possible to coat the workpieces on a conveyor from all or nearly all sides during a single pass through the coating station.

The invention is embodied in an apparatus for spray coating workpieces, especially in an electrostatic spray coating apparatus. The apparatus comprises an endless apertured conveyor which serves to advance the workpieces along a predetermined path (preferably along a substantially horizontal path), a spray generator which is disposed above the path and has means for directing a spray of atomized coating material against the workpieces in the path, a spray intercepting web which is disposed beneath the path, first drive means for moving the conveyor at a first speed, and second drive means for moving the web at a second speed less than the first speed. The first drive means can include means for moving the conveyor in a predetermined direction, and the second drive means can comprise means for moving the web in the same (predetermined) direction, at least in the region where the web is disposed in the path of the spray of atomized coating material which bypasses the conveyor and the workpieces in the path.

The conveyor can comprise a plurality of substantially wire-like components (this term is intended to embrace cords, wires, ropes, strips, filaments and like elongated parts). The conveyor can contain or consist of an electrically insulating material, such as a plastic insulating material.

The conveyor includes a first portion (e.g., an elongated substantially horizontal upper reach of an endless belt-like conveyor) and a second portion which is located downstream of the first portion (as seen in the predetermined direction) and can constitute or form part of a lower or return reach of the endless belt-like conveyor. The apparatus can further comprise means for mechanically, chemically and/or otherwise cleaning successive increments of the second portion of the conveyor.

The web can consist of or it can contain paper, and its weight is preferably less than 41 g/m$^2$. If desired, the web can include elongated first and second sections which are respectively located beneath first and second longitudinally extending marginal portions of the aforementioned upper reach of the endless conveyor; this entails additional savings in the material of the web.

The second drive means can include means for intermittently moving the web, either at the speed of the conveyor or at a lower speed, as long as the average speed of the web is less than the speed of the conveyor. The apparatus can further comprise means for operating the second drive means (for the web) as a function of the extent of accumulation of coating material thereon i.e., as a function of the extent of contamination of the web. Such operating means can include means for monitoring the thickness and/or other characteristics of the accumulation of coating material on successive or spaced-apart increments of the continuously or intermittently running web.

If the spray generator includes or constitutes an electrostatic spray generator, the conveyor is or can be grounded and contains or can contain, or consists of or contains, an electrically conductive material. Moreover, if the spray generator is or includes an electrostatic spray generator, the apparatus can further comprise means for effecting a contactless discharge of workpieces, and such means can include an air ionizing neutralizing device which is disposed beneath the web opposite the locus of impingement of the spray of coating material upon the workpieces in the path. The neutralizing device includes means for ionizing air within a predetermined range around such device, and a portion of the web is located within this range. The neutralizing device can include a plurality of upwardly extending pointed ionizing portions, and such ionizing portions can form several rows which extend substantially transversely of the direction of movement of the workpieces along their path. The neutralizing device can further comprise means for connecting selected rows of ionizing portions to a source of energy, i.e., for selecting the range of ionization of air in the region of the path.

When the conveyor is loaded with workpieces, its work supporting reach does or can descend to a predetermined level, and the web is preferably positioned in such a way that it is located immediately beneath such level but is still out of contact with the conveyor, even if the conveyor is fully loaded with workpieces.

The apparatus can further comprise a housing for the spray generator, and a portion of the web can constitute the intermittently or continuously moving bottom wall of such housing. Means can be provided to maintain the interior of the housing below atmospheric pressure.

The web is or can be permeable to air but is preferably impermeable to the spray of coating material. To this end, the web can be formed with a plurality of minute holes, e.g., in the form of pores. The web can constitute a fleece or layer of non-woven fibrous or filamentary material.

The novel features which are considered as characteristic of the invention are set forth in particular in the appended claims. The improved apparatus itself, however, both as to its construction and its mode of operation, together with additional features and advantages thereof, will be best understood upon perusal of the following detailed description of certain specific embodiments with reference to the accompanying drawing.

BRIEF DESCRIPTION OF THE DRAWING

FIG. 1 is a schematic partly elevational and partly vertical sectional view of an apparatus which embodies one form of the invention and wherein the mask which serves to intercept sprays of coating material that bypass the conveyor and the workpieces is a one-piece paper web;

FIG. 2 is an enlarged plan view of a workpiece, of a portion of the web and of a portion of the conveyor in the apparatus of FIG. 1;

FIG. 3 is an enlarged elevational view of a detail in the apparatus of FIG. 1;

FIG. 4 is a plan view of a neutralizing device in the structure of FIG. 3, with the workpiece, web and conveyor omitted; and FIG. 5 is a fragmentary plan view of a file of abutting workpieces and of a modified two-piece web which extends laterally beyond the sides of the file of workpieces.

DESCRIPTION OF THE PREFERRED EMBODIMENTS

FIG. 1 shows an apparatus which is used to spray coat a series of discrete workpieces 10 on the horizontal upper reach of an endless apertured conveyor 11. The upper reach of the conveyor 10 defines an elongated horizontal path for the workpieces 10 and is located in or close to the bottom part of a housing or cabin 1 for a spray generator 4. A vacuum pump 3 is provided to maintain the interior 2 of the housing 1 below atmospheric pressure. The spray generator 4 comprises a rotary atomizer 5 which is adjustable up and down, i.e., away from and toward the path of the workpieces 10. A lower position of the rotary atomizer 5 is shown in FIG. 1 by broken lines. The arrow A indicates the direction of transport of workpieces 10 past the atomizer 5. The latter is preferably oscillatable transversely of the direction which is indicated by the arrow A so as to effect a more accurate or more predictable coating of selected sides or surfaces of successive workpieces 10 on the conveyor 11. The coating material is a liquid or a paste which is stored in a receptacle 9 and is drawn into a conduit 6 by a pump 8 to flow through a metering device 7 and into the atomizer 5. It is clear that the spray which is formed by the rotary atomizer 5 can contain several ingredients each of which can be delivered to the atomizer from a discrete source by way of a discrete conduit containing a pump and a metering device. If the apparatus is an electrostatic coating apparatus which serves to spray coating material onto workpieces 10 consisting of a material which is a good conductor of heat, the receptacle 9 and the conduit 6 are or can be made of an electrically insulating material so that a high potential can be applied to the workpieces.

The workpieces 10 can constitute copper-lined plate-like conductors which are to be coated with a photosensitive resist or with a solder resist. However, the apparatus can be used with similar or equal advantage to spray the just mentioned or other coating materials onto other types of workpieces which may but need not constitute plates.

The conveyor 11 is made of a plurality of wire-like components 12 (FIG. 2) which define apertures in the form of windows, slots, interstices or the like. As shown in FIG. 2, The components 12 can extend only in the longitudinal direction of the conveyor 11; however, it is equally possible to employ a lattice-like or any other conveyor which defines apertures for the passage of that portion of the spray which bypasses and/or fails to adhere to the workpieces. It is presently preferred to employ wire-like components 12 having a substantially circular cross-sectional outline. For example, the components 12 can be made of a plastic material, such as polyamide.

The drive means for moving the conveyor 11 comprises a constant-speed or variable-speed electric or other motor 14 which drives the conveyor in the direction of arrow A. The components 12 of the conveyor 11 are trained over a pulley 13 which is driven by a motor 14, a deflecting or tensioning roll 15, a pulley 16, additional deflecting or tensioning rolls 17, 18 and 19, and an idler pulley 20. The underside of the upper reach of the conveyor 11 is adjacent the upper sides of plate- or plane-like supporting members 21, 22 which flank the lower end portion of the housing 1 and prevent excessive sagging of the upper reach when the latter is loaded with workpieces 10. The upper sides of the supporting members 21, 22 determine the lowest level of the upper reach of the conveyor 11.

The lower or return reach of the conveyor 11 passes through a cleaning device which includes a liquid-containing vessel 23 and the aforementioned pulley 16. Successive increments of the lower reach of the conveyor 11 are caused to dip into the body of liquid in the vessel 23 to be relieved of some or all of the sprayed coating material. The liquid in the vessel 23 can be a suitable chemical. However, it is equally within the purview of the invention to replace the cleaning device 16, 23 by, or to use such cleaning device jointly with, one or more mechanical cleaning devices (not shown) which can employ rotary brushes or like removing elements. If the cleaning device employs a liquid cleaning medium, successive increments of the cleaned lower reach of the conveyor 11 can be caused to pass through a suitable dryer in which the components 12 are relieved of moisture by jets of hot air or in any other suitable way.

The reference character 24 denotes a second conveyor whose receiving end is adjacent the discharge end of the upper reach of the conveyor 11 and which serves to accept freshly coated workpieces 10 for transport to storage or to a further treating or processing station. For example, the upper reach of the conveyor 24 can transport successive freshly coated workpieces 10 through a drying unit of any suitable design.

In accordance with a feature of the invention, the apparatus further comprises a mask in the form of an elongated web 25 which can be drawn off a supply reel 26 and can be collected on a takeup reel 28 at a level beneath the upper reach of the conveyor 11. Two guide rollers 29, 30 are provided to maintain a portion of the web 25 at a level immediately adjacent and beneath the lowermost possible level of the upper reach of the conveyor 11 between the supporting members 21 and 22. A drive means 27 (including an electric or an otherwise powered stepping or variable-speed or constant-speed motor) is provided to drive the takeup reel 28 and to thereby advance the web 25 in the direction of arrow A, i.e., from the supply reel 26, over the guide rollers 29, 30 and onto the core of the takeup reel 28. That portion of the web 25 which is located beneath the atomizing device 5 (between the guide rollers 29, 30) can be said to constitute a mobile bottom wall of the housing 1. Such bottom wall preferably seals or practically seals the lower end of the housing 1 in order to facilitate the task of the vacuum pump 3.

As can be seen in FIG. 2, the width of the web 25 exceeds the width of the conveyor 11 so that the web 25 can readily intercept that portion of the spray which bypasses the workpieces 10 and the components 12 of the conveyor 11 and/or which fails to adhere to 10 and/or 12. The web 25 can be made of or can contain paper, and its weight is preferably less than 41 g/m$^2$. It is presently preferred to employ paper having a weight of approximately 30 g/m$^2$.

FIG. 2 shows that the web 25 has minute holes or pores 31 which are large enough to render the web permeable to air but too small to permit passage of the spray of coating material. Thus, the web 25 effectively shields the inner side of the lower reach of the conveyor 11 and the surrounding area from contamination by sprays of coating material. It is also possible to employ a web 25 which constitutes a non-woven fleece of fibrous or filamentary material, particularly a material which is capable of absorbing and retaining large quantities of coating material.

The speed at which the web 25 is driven by its motor 27 is or can be a small, or even a minute, fraction of the speed of the conveyor 11. If the takeup reel 28 is driven stepwise, the average speed of the web 25 per unit of time is or can be much less than the speed of the conveyor 11. This brings about substantial savings in the material of the web 25 because the latter does not advance at the speed of the upper reach of the conveyor 11. As mentioned above, the width of the web 25 can be readily selected in such a way that the upper side of the web between the guide rollers 29, 30 intercepts all coating material which bypasses the components 12 of the conveyor 11 and the workpieces 10.

The reference characters 107 denote portions of a conductor which transmits signals from the metering device 7 to the controls 127 for the motor 27 so as to ensure that the web 25 can be driven (either continuously or stepwise) at a speed which is a function of the quantity of coating material on those increments of the web that advance beyond the guide roller 30. This ensures that the rate at which the takeup reel 28 collects the web 25 is best suited to ensure an optimum utilization of the web and maximum savings in its material. It is clear that other types of means for operating the controls 127 can be used with equal or similar advantage. For example, the apparatus can be equipped with optical and/or mechanical sensor means which can ascertain the quantity of coating material per unit length of the web 25 downstream of the guide roller 30. It is also possible to select one or more additional parameters to determine the quantity of coating material per unit length of the web 25, for example, the rate at which the weight of the takeup reel 28 or the weight per unit area of the web increases when the apparatus is in use.

An advantage of the feature that the workpieces 10 are not advanced directly by the web 25 is that they cannot come in direct contact with lint or with like substances which are likely to be found on the surface of the web.

The spray coating operation is preferably assisted or promoted by electrostatic means. To this end, the spray generator 4 further comprises a high voltage generator 31 having a high-voltage terminal connected to the rotary atomizer 5. Moreover, the apparatus further comprises a means for effecting contactless discharge of workpieces 10, and such means includes an air ionizing neutralizing device 32 which is located beneath the web 25 in the region between the guide rollers 29, 30, i.e., in the region where the rotary atomizer 5 sprays coating material upon the workpieces 10 in their path on the upper reach of the conveyor 11. The purpose of the neutralizing device 32 is to effect a discharge of workpieces 10 so that each workpiece which advances beyond the device 32 merely contains a harmless residual charge. The particles of atomized coating material follow the field lines and thus bring about a highly satisfactory uniform coating of successive workpieces 10 beneath the rotary atomizer 5. An auxiliary electrode 33 is provided to shape the field in such a way that the pattern of spray which is formed by the atomizer 5 has a substantially elliptical shape.

As can be seen in FIGS. 3 and 4, the neutralizing device 32 comprises several rows of upwardly extending pointed ionizing portions 34 each of which ionizes air in the adjacent region or zone immediately or closely beneath the web 25 between the guide rollers 29 and 30. This can be achieved in a rather simple and inexpensive way by placing each pointed portion 34 adjacent an insulated conductor which is connected to a source of high-voltage a-c energy. Reference may be had, for example, to German Offenlegungsschrift No. 24 46 767. Files or rows of pointed portions 34 extend from longitudinally extending grooves of rods 35 which can be individually connected to a source U of high-voltage energy by high-tension conductor means 36 containing switches 37. One end portion of each rod 35 is grounded and the other end portion of each such rod is connected with the respective conductor 36. Ionized molecules of air can penetrate through the web 25 to neutralize the adjacent workpiece or workpieces 10.

The distance of the tips of pointed portions 34 from the underside of the web 25 between the guide rollers 29 and 30 is very small; in fact, it is even possible to permit the tips of the pointed portions 34 to actually contact the web 25. The distance of the upper side of the web 25 between the rollers 29, 30 from the upper reach of the conveyor 11 between the supporting members 21, 22 is also very small; as mentioned above, the arrangement is preferably such that the components 12 of the conveyor 11 do not come into actual contact with the web 25. All that counts is to ensure that the workpieces 10 on the upper reach of the conveyor 11 can advance along a path which is closely or immediately adjacent the neutralizing device 32 to thus ensure a substantial or pronounced neutralization of each freshly coated workpiece. In other words, such selection of the level of the path for workpieces 10 with reference to the ionized zone around the pointed portions 34 contributes to greater effectiveness of the neutralizing device 32.

The rods 35 preferably extend in the direction of advancement of the workpieces 10 in the direction of arrow A and are arranged side-by-side transversely of said direction. By opening or closing one or more switches 37, the operators or an automatic control system can select the width of the zone in which the neutralizing device 32 is effective so that the width of such zone conforms, or is properly related, to the length of successive workpieces 10 at the coating station.

If the apparatus is designed to operate electrostatically and the distance of the workpieces 10 on the conveyor 11 from the web 25 is properly selected (e.g., if such distance is approximately 20 mm), the apparatus can apply sprays of suitable coating material to the vertically extending sides or faces of the workpieces in what can be termed a wrap-around manner. If the distance of the workpieces 10 from the web 25 (between the rollers 29, 30) is reduced considerably (e.g., to approximately 2 mm), the rotary atomizer 5 can coat all upwardly extending sides of successive workpieces (in addition, of course, to the upper side of each workpiece) without spraying coating material upon the marginal portions of the undersides of the workpieces. This is desirable in many instances.

FIG. 5 shows that the workpieces 110 can be placed end-to-end so that they form a composite band which intercepts the entire spray of coating material between their lateral sides. In such apparatus, a one-piece web 25 can be replaced with a two-piece web having two spaced-apart strip-shaped sections 125 each of which is located below the respective marginal portion of the conveyor (not shown in FIG. 5). This renders it possible to achieve substantial additional savings in the material of the web.

It is clear that the improved apparatus can further comprise many additional units or assemblies which are standard or necessary parts of conventional apparatus. For example, the apparatus can include one or more dust precipitation chambers for freshly coated workpieces 10 and/or one or more dust precipitation chambers for the coated portion of the web 25 or web sections 125.

The neutralizing device 32 of FIGS. 1, 3 and 4 can be omitted if the wire-like components 12 of the conveyor 11 constitute or include electrical conductors which are grounded so that each workpiece 10 on such conductors is connected directly to the ground. In such apparatus, the components 12 are likely to gather and retain larger quantities of coating material. Therefore, it is often preferred to employ the apparatus which is shown in FIG. 1 and wherein the neutralizing device 32 effects a contactless discharge of workpieces 10 by ionized air in the region between the guide rollers 29 and 30 for the web 25. The ionizing operation enhances the conductivity of air at the coating station to thus ensure that the charges which are applied to workpieces by ionized droplets of coating material are reduced to a negligible value as a result of the placing of neutralizing device 32 immediately or closely below the web 25 opposite the atomizer 5. The charge of each workpiece 10 is reduced to such an extent that the likelihood of spark discharge is nil or practically nil. When the ionizing is effected with the utilization of a-c current, there develops a capacitative charge formation at the surfaces of the workpieces.

The web 25 also serves as a means for shielding the neutralizing device 25 from direct contact with the particles of coating material. Since the web 25 is permeable to air but not to the spray of coating material, ionized air can readily reach the workpieces 10 by penetrating through the web 25 and through the apertures of the conveyor 11 but the particles of coating material cannot penetrate beyond the web 25 in the region between the rollers 29 and 30. Permeability to air (with simultaneous prevention of penetration of coating material) can be achieved by providing the web 25 with the aforementioned fine holes 31 or by making the web of a non-woven fibrous or like material. As mentioned above, an advantage of non-woven fibrous materials is that they can retain large quantities of coating material. Ionized air is particularly likely to reach the workpieces 10 on the conveyor 11 if the neutralizing device 32 is placed close or very close to (or in actual contact with) the underside of the web 25 so that the web is located in the ionization zone that is developed by the device 32. The provision of pointed portions 34 entails a further shortening of the path for travel of ionized air to the workpieces 10 on the conveyor 11.

The provision of rods 35 and discrete switches 37 for such rods constitutes an optional but desirable feature of the neutralizing device 32. Such design renders it possible to select the width of the neutralizing zone in dependency on the dimensions of the workpieces and/or other parameters.

The housing or cabin 1 also constitutes an optional but desirable feature of the improved apparatus. Such housing reduces the likelihood that air currents could affect the rate of application of coating material to the workpieces 10 on the conveyor 11. Moreover, the housing 1 renders it possible to reduce the pressure in the region of the coating station to below atmospheric pressure. This imparts to air, which is ionized by the device 32, an additional impetus to flow toward the workpieces 10 on the conveyor 11.

An important advantage of the improved apparatus is that the web or mask 25 need not serve as a means for conveying the workpieces 10 past the coating station. At a first glance, such departure from heretofore known proposals would appear to constitute a retrogression since the improved apparatus must employ masking material in addition to employing a conveyor for workpieces. However, the savings in masking material are so pronounced that they mole than compensate for the need for a discrete conveyor for workpieces. In addition, the conveyor 11 maintains the workpieces out of direct contact with the web 25 so that the workpieces cannot come into contact with lint and other particles which are invariably present or are likely to be present when the web is made of a fibrous or like material.

The speed of the conveyor 11 can greatly or considerably exceed the speed of the web 25. This ensures that the web 25 can be used with a much higher degree of efficiency than if it were to advance at the speed of the conveyor 11. Moreover, the gaps between successive workpieces 10 move relative to the webs 25 so that the latter then accumulates significant quantities of coating material per unit length. Still further, and since the conveyor 11 preferably consists (either exclusively or primarily) of a relatively small number of wire-like components 12, it is now possible to coat those portions of workpieces 10 on such conveyor which cannot be coated if the workpieces are in full surface-to-surface contact with a web of paper or the like as in conventional apparatus. Thus, the spray which is formed and directed by the rotating atomizer 5 can reach all lateral surfaces of the advancing workpieces 10 and can even coat the marginal portions of the undersides of such workpieces. Such coating is possible without the establishment of films of coating material between the lateral surfaces of the workpieces and the adjacent portions of the conveyor. The absence of such films is desirable and advantageous because this ensures that the coated workpieces can be readily transferred from the conveyor 11 onto the conveyor 24 without the necessity to break layers or films of coating material which would develop if the workpieces were supported directly by the web 25 and whose destruction would or could lead to exposure of certain portions of workpieces which must or should be coated when the workpieces are put to use.

The utilization of a conveyor 11 with wire-like components 12 is preferred at this time because the area of contact between the components 12 and the workpieces 10 thereon is minimal, i.e., each component 12 is in mere multi-point or (at most) linear contact with the adjacent workpiece. Moreover, the rate of accumulation of coating material on such components is minimal so that the cleaning operation at 16, 23 need not involve the removal of large quantities of coating material. In addition, the tensile strength of wire-like components 12 is incomparably greater than that of a paper web so that the conveyor 11 can transport large numbers of workpieces 10 per unit length without the danger of excessive sagging or other deviations from an optimum path for transport of workpieces past the coating station. A conveyor which comprises two or more wire-like components can properly transport workpieces at an optimum distance from the atomizer 5 regardless of whether the weights of the workpieces are identical or vary from workpiece to workpiece within a wide range. Many types of insulating plastic material have been found to be highly satisfactory for the making of components 12 because their specific weight is low and the tensile strength of the components 12 is high.

The cleaning unit 16, 23 is an optional feature of the apparatus. It is preferred in most instances because a cleaning of successive increments of the return reach of the conveyor 11 ensures that successive workpieces come in contact with clean portions of the conveyor 11 upstream of the coating station. The manner in which the workpieces 10 are deposited on or fed to the upper reach of the conveyor 11 forms no part of the invention.

An additional important advantage of the improved apparatus is that, since the web 25 need not support the workpieces 10 during travel past the coating station, the strength, thickness and weight of the web can be reduced to a bare minimum, i.e. to a value which suffices to ensure that the web can stand the pull which is necessary to transport it from the supply reel 26 to the takeup reel 28 and to support the weight of coating material which accumulates thereon during travel between the guide rollers 29 and 30. As mentioned above, the weight of the web 25 need not exceed 40 g/m$^2$ and can be much less (e.g., 30 g/m$^2$). The weight of the web in a conventional apparatus, wherein the web serves as a conveyor for the workpieces, cannot be reduced below 50 g/m$^2$. Thus, savings in material of the web 25 are achieved because the web is driven at a speed less than that of the conveyor 11 and also because the weight of the web per unit area is or can be much less than the weight per unit area of a web which serves to convey the workpieces past the coating station. Additional savings are or can be achieved if the workpieces are transported end-to-end as shown in FIG. 5 because this renders it possible to employ a two-piece web having a pair of relatively narrow sections 125 whose combined width can be a relatively small fraction of the width of a one-piece web.

Savings in the material of the web can be increased still further by appropriate selection of the ratio of the speed of the conveyor 11 to the speed of the web. As mentioned above, the conveyor 11 can be driven continuously and the web 25 can be driven stepwise or continuously, preferably always in such a way that the average speed of the web is less than that of the conveyor. As also mentioned above, it is possible to regulate the speed of the web 25 as a function of one or more parameters which are indicative of the extent to which the web is laden with coating material. It is possible to measure the weight of the coated web per unit area, to monitor its ability to permit, or its resistance to prevent, penetration of certain types of radiation, or to monitor (as shown) the quantity of coating material which is delivered by the pump 8 because it is rather simple to ascertain that percentage of such material which lands on and is retained by the web.

Without further analysis, the foregoing will so fully reveal the gist of the present invention that others can, by applying current knowledge, readily adapt it for various applications without omitting features that, from the standpoint of prior art, fairly constitute essential characteristics of the generic and specific aspects of our contribution to the art and, therefore, such adaptations should and are intended to be comprehended within the meaning and range of equivalence of the appended claims.

We claim:

1. Apparatus for spray coating workpieces, comprising an endless apertured conveyor arranged to advance workpieces along a predetermined path; an electrostatic spray generator disposed above said path and having means for directing a spray against the workpieces in said path; a spray intercepting web disposed beneath said path; drive means for said conveyor; and means for effecting a contactless discharge of workpieces including an air ionizing neutralizing device disposed beneath the web opposite the locus of impingement of coating material upon the workpieces in said path.

2. The apparatus of claim 1, wherein said path is substantially horizontal and said drive means includes means for moving said conveyor in a predetermined direction at a first speed, and further comprising second drive means for moving the web at a second speed less than said first speed, said second drive means including means for moving the web in said predetermined direction.

3. The apparatus of claim 1, wherein said conveyor includes a plurality of substantially wire-like components.

4. The apparatus of claim 1, wherein said conveyor contains an electrically insulating material.

5. The apparatus of claim 4, wherein said material is a plastic material.

6. The apparatus of claim 1, wherein said drive means includes means for moving said conveyor in a predetermined direction, said conveyor including a first portion which defines said path and a second portion downstream of said first portion, and further comprising means for cleaning the second portion of said conveyor.

7. The apparatus of claim 6, wherein said conveyor includes an elongated upper reach which constitutes said first portion and a second reach which constitutes said second portion.

8. The apparatus of claim 1, wherein said web consists of or contains paper.

9. The apparatus of claim 1, wherein said web has a weight of less than 41 $g/m^2$.

10. The apparatus of claim 1, wherein said conveyor includes first and second marginal portions and said web includes first and second elongated sections beneath said first and second marginal portions, respectively.

11. The apparatus of claim 1, wherein said drive means includes means for moving said conveyor at a first speed, and further comprising second drive means for moving the web at a second speed less than said first speed, said second drive means including means for intermittently moving the web.

12. The apparatus of claim 1, wherein said drive means includes means for moving said conveyor at a first speed, and further comprising second drive means for moving the web at a second speed less than said first speed, and means for operating said second drive means as a function of the extent of accumulation of coating material thereon.

13. The apparatus of claim 1, wherein said spray generator includes an electrostatic spray generator and said conveyor is grounded and contains an electrically conductive material.

14. The apparatus of claim 1, wherein said neutralizing device includes means for ionizing air within a predetermined range therearound and said web is located within said range.

15. The apparatus of claim 1, wherein said neutralizing device includes a plurality of upwardly extending pointed ionizing portions.

16. The apparatus of claim 16, wherein said drive means includes means for moving the conveyor in a predetermined direction, said ionizing portions forming a plurality of rows extending substantially in said predetermined direction.

17. The apparatus of claim 16, wherein said neutralizing device further comprises means for connecting selected rows of ionizing portions to a source of energy.

18. The apparatus of claim 1, wherein said conveyor includes a portion which defines said path and is located at a predetermined level when said portion is loaded with workpieces, said web including a portion which is immediately adjacent but located beneath said level.

19. The apparatus of claim 1, further comprising a housing for said spray generator, said housing having a bottom wall constituted by a portion of said web.

20. The apparatus of claim 19, further comprising means for maintaining the interior of said housing below atmospheric pressure.

21. The apparatus of claim 1, wherein the web is permeable to air.

22. The apparatus of claim 21, wherein the web is impermeable to the spray of coating material.

23. The apparatus of claim 21, wherein the web has a plurality of minute holes.

24. The apparatus of claim 1, wherein the web consists of non-woven fibrous material.

* * * * *